United States Patent [19]

Inokuti et al.

[11] Patent Number: 4,690,855

[45] Date of Patent: Sep. 1, 1987

[54] SUBSTRATE FOR PRINT CIRCUIT BOARD, A PRINT CIRCUIT BOARD, AND METHOD OF MANUFACTURING THE SAME

[75] Inventors: Yukio Inokuti; Shigeko Ikeda; Toshihiko Funahashi; Yo Ito, all of Chiba, Japan

[73] Assignee: Kawasaki Steel Corporation, Kobe, Japan

[21] Appl. No.: 906,599

[22] Filed: Sep. 10, 1986

Related U.S. Application Data

[63] Continuation of Ser. No. 664,587, Oct. 25, 1984, abandoned.

[30] Foreign Application Priority Data

Dec. 28, 1983 [JP] Japan .................. 58-251746

[51] Int. Cl.⁴ .............. B32B 15/04; B32B 15/16; B05D 3/07; B05D 1/12
[52] U.S. Cl. ................... 428/209; 428/446; 428/702; 428/471; 428/901
[58] Field of Search ........... 428/209, 702, 704, 446, 428/215, 471, 901

[56] References Cited

U.S. PATENT DOCUMENTS

| | | | |
|---|---|---|---|
| 2,109,271 | 2/1938 | Krause | 428/702 X |
| 2,602,758 | 7/1952 | Olt et al. | 428/215 |
| 3,136,658 | 6/1964 | Richards | 428/471 |
| 3,197,335 | 7/1965 | Leszynski | 428/215 X |
| 4,105,821 | 8/1978 | Blaich et al. | 428/215 |
| 4,219,607 | 8/1980 | Cammack et al. | 428/704 X |
| 4,273,822 | 6/1981 | Bube | 428/215 X |
| 4,309,485 | 1/1982 | Kondo et al. | 428/471 X |
| 4,322,478 | 3/1982 | Forsberg | 428/471 |
| 4,510,195 | 4/1985 | Iida et al. | 428/215 |

FOREIGN PATENT DOCUMENTS

| | | |
|---|---|---|
| 1242282 | 11/1961 | Fed. Rep. of Germany . |
| 62389 | 1/1981 | Japan . |
| 3673 | 3/1981 | Japan . |
| 88344 | 5/1981 | Japan . |
| 10994 | 4/1982 | Japan . |
| 1276526 | 10/1969 | United Kingdom . |

Primary Examiner—Nancy A. Swisher
Attorney, Agent, or Firm—Balogh, Osann, Kramer, Dvorak, Genova & Traub

[57] ABSTRACT

A substrate for print circuit board comprising a steel sheet, a forsterite film layer formed on at least one surface of the steel sheet, and an insulating film layer formed on the forsterite film layer by baking a coating solution mainly consisting of a phosphate and colloidal silica. A print circuit board having a conductive pattern on the insulating film layer of the substrate for print circuit board, and methods of manufacturing the substrate and the print circuit board. One of typical methods of manufacturing the substrate for print circuit board comprises steps of applying an annealing separator mainly consisting of MgO on the steel sheet and annealing it to form a forsterite film layer, applying and baking a coating solution mainly consisting of the phosphate and colloidal silica onto the forsterite film layer to form an insulating film layer. The print circuit board is obtained by bonding the conductive pattern to the insulating film layer and annealing at a temperature range of not lower than 300° C. but lower than 1,050° C.

16 Claims, 4 Drawing Figures

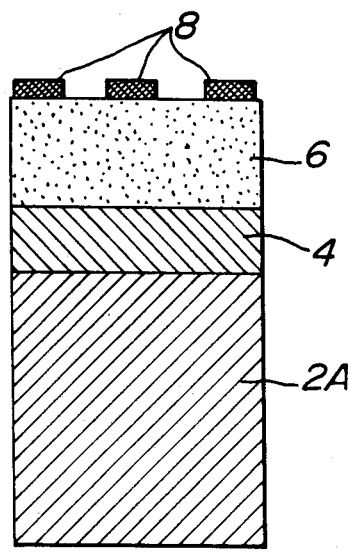
FIG_1
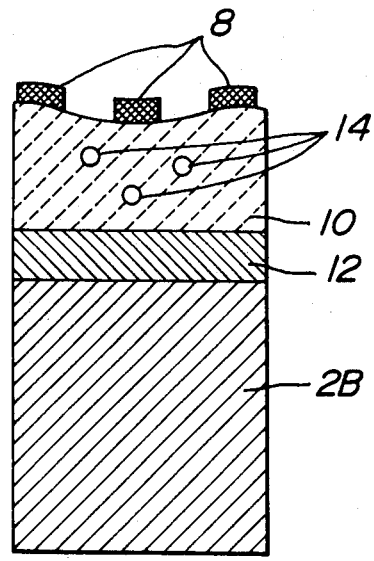
FIG_2  PRIOR ART

SUBSTRATE FOR PRINT CIRCUIT BOARD, A PRINT CIRCUIT BOARD, AND METHOD OF MANUFACTURING THE SAME

This is a continuation of application Ser. No. 664,587, filed on Oct. 25, 1984, now abandoned.

BACKGROUND OF THE INVENTION (1) Field of the Invention

The present invention relates to a substrate for print circuit board, a print circuit board and methods of manufacturing the same. More particularly, the invention relates to a substrate for print circuit board and a print circuit board which are excellent in mechanical and thermal characteristics and smoothness, and manufacturing methods thereof.

(2) Description of the Prior Art

With the development of electronic materials such as IC, LSI, power transistors and the like, there have recently been developed various print circuit boards. The print circuit boards are ordinarily classified into the hard print circuit boards mainly consisting of phenols, epoxy, and composite, and the flexible print circuit boards featured by their flexibility. However, the flexible print circuit boards have the drawbacks that they are still costly at present and difficult to use.

It is the recent trend that further miniaturization, densification and intensification of materials for electronics are demanded, the capacity becomes larger and the tip size are increased. It has become an important problem how to dissipate the heat generated from electronic parts and electronic circuits with the intensification and the large capacity. In order to resolve such a problem, there has been developed a so-called metal core print circuit board in which a metal sheet is used as a core. Particularly, there has recently been studied a method of constituting print circuit boards by using enamel steel sheets, which are disclosed, for instance, in Japanese Patent Laid Open Nos. 3,673/1981, 62,389/1981, 88,344/1981, 10,994/1982 and so on. The print ciruit boards using such enamel steel sheets have the merits that they are not only excellent in the mechanical and thermal characteristics but also they can be processed into any arbitrary profile prior to firing of the enamel.

However, the conventional IC and LSI circuit boards using the enamel steel sheet are subjected to the firing after the electroconductive or electric resistant ink is directly applied to print the enamel film layer, and often problems occur that the adhesion of the print circuit board is lowered due to the firing treatment at a high temperature, which may ultimately cause the peeling-off.

When the enamel of such a small thermal expansion coefficient as to meet that of the LSI tip or a conductive ink is used to avoid the above-mentioned drawbacks, there is a problem that excellent adhesion to the base steel sheet cannot be obtained. In view of the present situation that in the case of the print circuit board using the enamel steel sheet, the heat dissipation and the heat expansion are still unsatisfactory in addition to the above-mentioned drawbacks in the production of the recent IC and LSI print circuit boards, the appearance of a print circuit board which is fundamentally improved has been expected.

SUMMARY OF THE INVENTION

It is a first object of the present invention to provide a novel substrate for print circuit board and a novel print circuit board which are to overcome the above-mentioned drawbacks of the prior art print circuit boards, and are excellent in the mechanical and thermal characteristics and adhesion as well as smoothness, and methods of manufacturing the same, which are stable and effective.

It is a second object of the invention to provide methods of manufacturing substrate for print circuit board which comprises a steel sheet, a forsterite film layer formed on the steel sheet, and an insulating film formed on the forsterite film layer, and a print circuit board which further comprises a conductive pattern bonded to the insulating film layer, said method being able to further improve the adhesion between the base steel sheet and the forsterite film layer.

It is a third object of the invention to provide a method of manufacturing a substrate for print circuit board and a print circuit board excellent in adhesion between the steel sheet and the coated film layers to meet the demand in the prior art technique.

It is a fourth object of the present invention to provide a substrate for print circuit board and a print circuit board which are so excellent in insulating property and adhesion as to be used under the voltage and current applied to the print circuit board with the recent large capacity, and manufacturing methods thereof.

The gist of the substrate for print circuit board and the print circuit board according to the first object of the invention is as follows:

That is, the substrate for print circuit board comprises a steel sheet, a forsterite film layer formed on the steel sheet, an insulating film layer formed on the forsterite film layer which insulating film layer is obtained by baking a coating solution mainly consisting of a phosphate and colloidal silica. The print circuit board is obtained by forming a conductive pattern on the insulating film layer of the thus obtained substrate through bonding.

The manufacturing methods of the substrate for print circuit board and the print circuit board are as follows:

That is, the method of manufacturing the substrate for print circuit board comprises steps of applying an annealing separator mainly consisting of MgO on the surface of the steel sheet and annealing it to form the forsterite film layer, and applying and baking a coating solution mainly consisting of a phosphate and colloidal silica onto the forsterite film layer to form the insulating film layer. The print circuit board is manufactured by further bonding the conductive pattern onto the thus formed insulating film layer and annealing it at a temperature range of 300°–1,050° C.

The gist of the manufacturing methods of the substrate for print circuit board and the print circuit board according to the second object of the invention is as follows:

That is, the method of manufacturing the substrate for print circuit board comprises steps of applying an annealing separator mainly consisting of MgO upon the steel sheet and annealing it to form the forsterite film layer, and applying and baking the coating solution mainly consisting of a phosphate and colloidal silica to form the insulating film layer, wherein the concentration of the phosphate in a phosphate aqueous solution is 25–60% by weight. The print circuit board is manufactured by bonding the conductive pattern onto the insulating film layer and performing annealing at a temperature range of 300°–1,050° C.

The methods of manufacturing the substrate for print circuit board and the print circuit board according to the third object of the invention are performed as follows:

That is, according to the first aspect, the methods of manufacturing the substrate for print circuit board and the print circuit board with excellent adhesion to the steel sheet comprise steps of applying the annealing separator mainly consisting of MgO onto the surface of the steel sheet and annealing it to form the forsterite film layer, wherein the annealing separator mainly consisting of MgO contains 1–40% by weight of serpentine. According to the second aspect, similarly to the first aspect, the manufacturing methods of the substrate for print circuit board and the print circuit board comprise a step of forming the forsterite film layer, wherein the annealing separator mainly consisting of MgO contains at least one kinds of 1–30% by weight of an oxide of Mn and 1–30% by weight of an oxide of Ti besides 1–40% by weight of serpentine.

The substrate for print circuit board, the print circuit board and the manufacturing methods thereof according to the fourth object of the invention are attained as follows:

The substrate for print circuit board comprises a steel sheet, a forsterite film layer formed on the steel sheet, an insulating film layer formed on the forsterite film layer which insulating film layer is formed by baking the coating solution mainly consisting of the phosphate and the colloidal silica, and an enamel film layer coated onto the insulating film layer. The print circuit board is obtained by forming the conductive pattern onto the enamel film layer of the thus obtained substrate through bonding.

BRIEF DESCRIPTION OF THE DRAWINGS

FIG. 1 is an enlarged section view of a construction of a print circuit board according to one embodiment of the invention;

FIG. 2 is an enlarged section view of the conventional print circuit board having an enamel film layer;

DETAILED DESCRIPTION OF THE INVENTION

Figure 3:
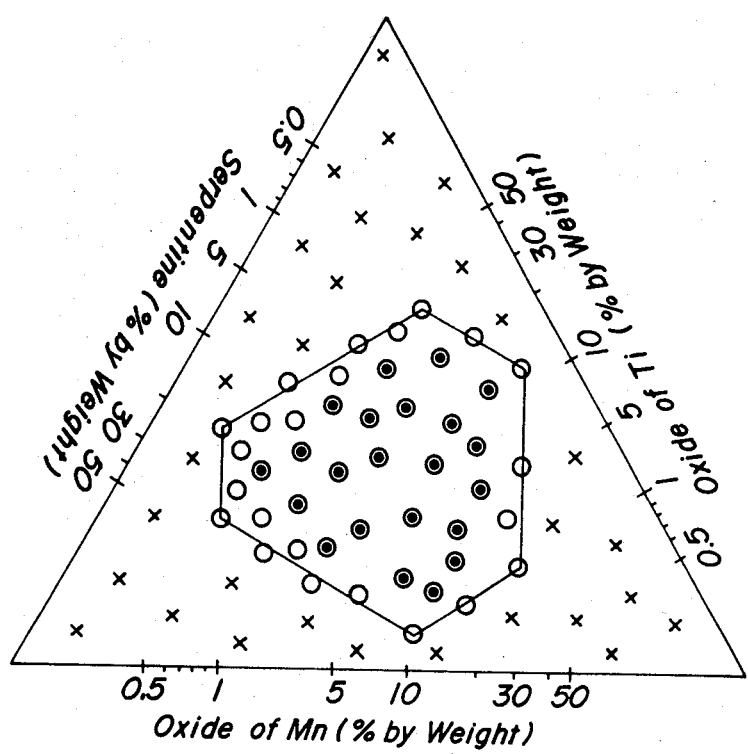
FIG. 3 shows the relation between the compounding ratios among the serpentine, an oxide of Mn and an oxide of Ti in the annealing separator, and adhesion of the print circuit board [the minimum diameter (mm) within which no peeling occurs in the adhesion test] after the annealing separator is applied and baked and an insulating film layer and a conductive pattern are formed thereon.

Having taken into account the fact that the insulating film layer excellent in the thermal resistance with improved iron loss and magnetic performances is obtained by forming the insulating film layer mainly consisting of a phosphate and colloidal silica onto the forsterite lower film layer formed by the reaction with an annealing separator mainly consisting of MgO at the time of secondary recrystallization annealing of a grain oriented silicon steel sheet, the present inventors have repeatedly made numerous trial experiments to apply this technique to the print circuit board, and accordingly have come to accomplish the invention.

Examples of the present invention will be explained with reference to a conventional print circuit board formed on the enamel substrate.

According to the print circuit board shown in FIG. 1, the annealing separator mainly consisting of MgO is applied onto the steel sheet containing 1.0–8.0% by weight of Si and it is annealed at 1,000° C. in $N_2$ gas for 30 minutes to form the forsterite film layer 4 on the surface of the steel sheet 2A, a coating solution mainly consisting of the phosphate and colloidal silica is applied and baked thereupon to form the insulating film layer 6, and the conductive pattern 8 is bonded onto the insulating layer 6.

Since the conventional enamel print circuit board as shown in FIG. 2 is first subjected to the pickling and Ni-flashing treatment as pretreatment for improving the adhesion between the base steel sheet 2B and the enamel layer 10, the print circuit board comprises an N-flashing film layer 12 formed on the base steel sheet 2B, the enamel layer 10 formed thereon, and the conductive pattern 8 formed on the uppermost layer.

Although the print circuit board according to the present invention and the conventional enamel print circuit board are constituted as mentioned above, bubbles 14 are formed in the enamel layer 10 of the enamel print circuit board shown in FIG. 2 to reduce the voltage tolerance, and since the amount of alkali metal oxide is made as small as possible for the formation of the enamel layer 10, the wetting property to the steel sheet 2B is inferior so that excellent adhesion cannot be obtained.

Further, since neither pickling nor Ni-dipping treatment as conventionally used are necessary in the invention when the steel sheet having the forsterite film 4 is used, no smut which may ordinarily be formed at the pickling is present, so that the enamel layer 6 containing no bubbles produced with the stable voltage tolerance can be obtained, thereby yielding an excellent print circuit board.

Further, the print circuit board shown in FIG. 1 according to the invention is not only excellent in the adhesion, heat resistance, and mechanical strength, but also the surface smoothness is extremely excellent with a beautiful gloss.

When the steel sheet containing 1.0–8.0% of Si is used as the base steel sheet 2A, as obvious from the comparison test in the following Example 3, the effects of the invention are most conspicuously exhibited.

The thickness of the forsterite film layer is preferably 1–4 $\mu$m. If it is thinner than 1 $\mu$m, the adhesion becomes deteriorated, and insulating property is poor.

The thickness of the insulating film layer is preferably 3–50 $\mu$m. If it is thinner than 3 $\mu$m, the particles of the forsterite film layer adversely affect the surface smoothness of the insulating film layer, whereas if it is too thick, adhesion is lowered.

As the phosphate used in the invention, the phosphates of Al, Na, K, Sr, Ba, Fe, Cd and Zn may be used in addition to those of Mg and Ca which are exemplified in the following Examples.

Next, annealing is required to be done after the conductive pattern 8 is bonded, and it is confirmed that according to the print circuit board of the invention, the annealing should be performed at a high temperature of 300°–1,050° C. The reason is that firing is insufficient and the conductive pattern cannot fully be bonded, when the temperature is less than 300° C., whereas the adhesion is in turn deteriorated when the annealing is done at an excessively high temperature over 1,050° C. It was recognized that the adhesion of the conductive pattern 8 was deteriorated in the annealing at a high temperature of not lower than 600° C. in the case of the conventional print circuit board.

The invention will be explained more in detail with reference to the following examples, which are given merely illustrative of the invention, but never interpreted to limit the scope thereof.

EXAMPLE 1

An annealing separator mainly consisting of MgO was applied onto a steel sheet 2A containing 2.2% of Si, and annealing was done at 1,100° C. in $N_2$ gas for 30 minutes to form a forsterite film layer 4 on the surface of the steel sheet. A coating solution containing magnesium phosphate and colloidal silica at such a ratio that 25% magnesium phosphate aqueous solution and 30% colloidal silica aqueous dispersion were mixed at 80 cc and 100 cc respectively was applied thereonto and baking was performed to form an insulating film layer 6. Then, the conductive pattern 8 was bonded onto the insulating film layer 6, and annealing was carried out at 750° C. for 1 minute. The resulting print circuit board had an excellent adhesion of the conductive pattern, and was excellent in heat resistance, mechanical strength and surface smoothness.

EXAMPLE 2

An annealing separator mainly consisting of MgO was applied to the steel sheet 2A containing 3.1% of Si, and annealing was performed at 1,100° C. in $N_2$ gas for 30 minutes to form a forsterite film layer 4. A coating solution containing calcium phosphate and colloidal silica at such a ratio that 13% calcium phosphate aqueous solution and 40% colloidal silica aqueous dispersion were mixed at 60 cc and 100 cc respectively was applied to the forsterite film layer 4, and baking was carried out to form an insulating film layer 6. Then, a conductive pattern was bonded to the insulating film layer 6, and annealing was carried out at 650° C. for 1 minute. The resulting print circuit board was excellent similarly to that in Example 1.

EXAMPLE 3

An annealing separator mainly consisting of MgO was applied onto each steel sheet containing Si respectively under the same conditions, and annealing was carried out at 1,100° C. in $N_2$ gas for 30 minutes to form a forsterite film layer 4. Then, a coating solution containing magnesium phosphate and colloidal silica at such a ratio that 25% magnesium phosphate aqueous solution and 30% colloidal silica aqueous dispersion were mixed at 60 cc and 100 cc respectively was applied to the forsterite film layer 4 and baking was carried out to form an insulating film layer 6. Thereafter, a conductive pattern 8 was bonded thereto, and annealing was carried out at 200° C., 700° C. and 1,100° C. for 1 minute.

As to nine kinds of the resulting print circuit boards, comparison tests were conducted with respect to adhesion between the base steel 2, and adhesion between the insulating film layer 6 and the conductive pattern 8. Results are shown in Table 1. The minimum diameter at 180° bending test in which no peeling occurred was determined, and the adhesion of the print circuit boards was evaluated as follows:

◎ : 15–20 mm
○ : 21–25 mm
x: more than 25 mm

TABLE 1

| Firing temperature (°C.) | Adhesion | Si content (% by weight) in steel sheet | | |
|---|---|---|---|---|
| | | 0.7 | 3.4 | 8.2 |
| 200 | base steel-insulating film layer | ◎ | ◎ | x |
| | insulating film layer-conductive pattern | x | x | x |
| 700 | base steel-insulating film layer | x | ○ | x |
| | insulating film layer-conductive pattern | ○ | ○ | ○ |
| 1,100 | base steel-insulating film layer | x | x | x |
| | insulating film layer-conductive pattern | x | ○ | x |

As obvious from the results in the comparison tests in Table 1, when Si in the base steel sheet was 0.7% being less than 1.0%, the adhesion between the base steel sheet and the insulating film layer was poor except at the firing at a low temperature of less than 300° C., whereas the adhesion between the insulating film and the conductive pattern was poor in all the cases except at the time of the annealing at 700° C., when the Si content was 8.2% being over 8.0%. This is because when the content of Si is less than 1.0%, the production amount of subscales containing $SiO_2$ is too small, whereas when the content of Si is too much over 8.0%, the subscales containing $SiO_2$ becomes excessive, so that excellent forsterite film are not formed in both cases.

Meanwhile, when the annealing temperature after the bonding of the conductive pattern is 200° C. being less than 300° C., the firing is insufficient, so that the conductive pattern cannot fully be bonded. To the contrary, the adhesion is inversely deteriorated in annealing at a high temperature of 1,100° C. being over 1,050° C.

Therefore, it is shown that when the content of Si is 3.4% being in a range of 1.0–8.0% and the annealing temperature after the bonding of the conductive pattern is 700° C. being in a temperature range of 300°–1,050° C., the adhesion both between the base steel and the insulating film layer and between the insulating film layer and the conductive pattern can well be obtained. Thus, the annealing temperature was restricted to the range of 300°–1,050° C.

As obvious from the above examples, according to the substrate for print circuit board and the print circuit board of the invention, the forsterite base film layer is formed on the steel sheet containing preferably 1.0–8.0% of Si, and the insulating film layer mainly made from the phosphate and colloidal silica is formed onto the surface of the forsterite base film layer, and additionally the conductive pattern is formed thereon followed by annealing at a high temperature of 300°–1,050° C. Accordingly, the invention has the following excellent effects:

(1) Since the substrate for print circuit board and the print circuit board according to the present invention are extremely excellent in the mechanical and thermal performances, they can fully comply with the increase in integration degree and increased capacity.

(2) The insulating property is large as a feature of the film mainly made from the phosphate and colloidal silica.

(3) The adhesion both between the base steel sheet and the insulating film layer and between the insulating film layer and the conductive pattern are extremely excellent.

(4) The surface smoothness is excellent, and no swelling is formed at the edge portion of the substrate and the print circuit board or around of through holes.

(5) Even when the conductive or resistant ink is directly applied for printing and firing is then done at a high temperature, the adhesion of the substrate for print circuit board and the print circuit board is not deteriorated, so that extremely stable production is possible as excellent substrate for print circuit board and excellent print circuit board for IC, LSI.

(6) Processing is easy.

The base steel sheet used in the present invention is not restricted to silicon steel sheet, but stainless steel and other kinds of steels may be used so long as they contain 1.0–8.0% of Si. The silicon steel containing not lower than 4.5% of Si may be produced, for instance, by a double roll type super quenching method or a single roll type super quenching method. For instance, the following are exemplified.

|    | Stainless steel (1) | Ferrite type stainless steel (2) | Austenite type stainless steel (3) |
|----|---------------------|----------------------------------|-----------------------------------|
| C  | 0.001–0.1           | 0.001–10.15                      | 0.001–0.15                        |
| Si | 1–8                 | 1–8                              | 1–8                               |
| Mn | 0.02–2              | 0.01–2                           | 0.01–2                            |
| Cr | —                   | 15–30                            | 15–26                             |
| Ni | —                   | —                                | 7–21                              |
| Fe | balance             | balance                          | balance                           |

In the cases of the stainless steels (2) and (3), 0.001–4.0% of Mo may be contained.

In the above-mentioned examples, the forsterite film layer, the insulating film layer and the conductive pattern are successively formed on the steel sheet in this order. But, another insulating film layer may be formed to protect the conductive pattern formed on the underside insulating film layer. Depending upon the use, one or more combinations each consisting of a conductive pattern and a protective insulating film layer therefor are laminated onto the underside protective insulating film layer thus formed.

Although the above explanation has been made on the print circuit board in which the conductive pattern is provided on one surface thereof, as a matter of course, the conductive pattern may be provided on both the opposite surfaces.

Next, the methods of producing substrate for print circuit board and the print circuit board according to the second object of the invention will be explained below.

Upon having repeatedly made numerous experiments on the methods in which the adhesion between the steel sheet and the insulating film layer is improved even in annealing at a high temperature, the inventors have found out that this problem can be resolved by making the thermal expansion coefficient of the insulating film layer formed on the forsterite film layer and mainly made from the phosphate and colloidal silica as large as possible to approach that of the base steel sheet.

That is, the inventors have found that the coating solution which is formed on the forsterite film layer and mainly consisting of one or more phosphate compounds (having a relatively large thermal expansion coefficient, such as phosphate compounds of Na, K, Ca, Sr, Ba, Fe, Cd, and Zn and in which the concentration of the phosphate compound is specifically restricted) is applied and baked onto the forsterite film layer to form the insulating film layer having a large thermal expansion coefficient, whereby the print circuit substrate with an excellent adhesion to the steel sheet can be manufactured even in the annealing at a high temperature after the conductive pattern is bonded. Thus, the inventors have accomplished the second object of the invention through repeatedly making numerous experiments.

Embodiments according to the second object of the invention will be described more in detail with reference to experiments conducted by the inventors.

A cold rolled steel sheet of 0.50 mm in thickness containing 2.8% of Si was annealed in a wet hydrogen atmosphere to form a subscales mainly consisting of $SiO_2$ on the surface of the steel sheet. Then, a slurry-like annealing separator mainly consisting of MgO was applied to the surface of the steel sheet in an amount of 10 $g/m^2$, and annealing was performed at 1,100° C. in $N_2$ gas for 3 hours to form a forsterite film on the surface of the steel sheet.

The forsterite-coated steel sheets thus obtained were divided into seven groups (A), (B), (C), (D), (E), (F), and (G) as shown in the following Table 2, and seven kinds of coating solutions were prepared in which the kinds, concentrations and amounts of aqueous solutions of phosphates, and the concentration and the amounts of an aqueous dispersion of the colloidal silica were varied. The coating solutions were applied to the surfaces of the respective forsterite coated steel sheets as grouped into the seven groups, and baked to prepare the above seven groups of samples with the different insulating film layers. Thereafter, a conductive pattern was bonded to the upper surface of each of the samples.

The samples of the seven groups (A), (B), (C), (D), (E), (F) and (G) thus prepared were annealed at different five temperatures of 905° C., 950° C., 1,000° C., 1,050° C., 1,100° C. for 5 minutes to obtain print circuit boards, which were subjected to the comparison tests on the adhesion to the base steel sheet of each of the print circuit boards. The adhesion was represented by the minimum diameter (mm) at which the coated film layers were not peeled off when the respective sample was bent at 180°. Results are shown in Table 2.

TABLE 2

| Sample | Sample symbol | Composition of coating solution | | Adhesion to steel sheet | | | | |
|---|---|---|---|---|---|---|---|---|
| | | | | 905° C. | 950° C. | 1,000° C. | 1,050° C. | 1,100° C. |
| Present invention | (A) | 25% calcium phosphate aqueous solution | 80 ml | 10 | 10 | 15 | 20 | 50 |
| | | 20% colloidal silica aqueous dispersion | 80 ml | | | | | |
| | (B) | 30% strontium phosphate aqueous solution | 85 ml | 15 | 15 | 20 | 20 | 40 |
| | | 30% colloidal silica aqueous dispersion | 90 ml | | | | | |
| | (C) | 50% zinc phosphate aqueous solution | 45 ml | 10 | 10 | 15 | 15 | 40 |
| | | 20% colloidal silica aqueous dispersion | 180 ml | | | | | |

TABLE 2-continued

| Sample | Sample symbol | Composition of coating solution | | Adhesion to steel sheet | | | | |
|---|---|---|---|---|---|---|---|---|
| | | | | 905° C. | 950° C. | 1,000° C. | 1,050° C. | 1,100° C. |
| | (D) | 30% calcium phosphate aqueous solution | 50 ml | 10 | 10 | 10 | 15 | 40 |
| | | 30% barium phosphate aqueous solution | 40 ml | | | | | |
| | | 30% colloidal silica aqueous dispersion | 90 ml | | | | | |
| Reference example | (E) | 40% aluminum phosphate aqueous solution | 40 ml | 45 | 50 | 50 | 60 | 60 |
| | | 30% colloidal silica aqueous dispersion | 100 ml | | | | | |
| | (F) | 20% magnesium phosphate aqueous solution | 70 ml | 45 | 50 | 55 | 60 | 60 |
| | | 30% colloidal silica aqueous dispersion | 100 ml | | | | | |
| | (G) | 15% zinc phosphate aqueous solution | 50 ml | 45 | 50 | 50 | 60 | 60 |
| | | 30% colloidal silica aqueous dispersion | 80 ml | | | | | |

As shown in Table 2, although more excellent adhesion of the print circuit board in which the conductive pattern was bonded to the insulating film layer having a large thermal expansion as in the case of the samples (A), (B), (C) and (D) is assured at an annealing temperature range of more than 900° C. and less than 1,050° C., the adhesion is rapidly deteriorated when the annealing temperature exceeds 1,050° C. Further, since the annealing at a high temperature over 900° C. is intended according to the second object of the invention, it is confirmed that the upper limit of the annealing temperature is limited to 1,050° C., so that the annealing temperature is limited to the temperature range of higher than 900° C. and up to 1,050° C.

On the other hand, as to the print circuit board in which the conductive pattern is bonded to the insulating film layer of a small thermal expansion as in the case of the samples (E) and (F), it was confirmed that the adhesion to the base steel sheet was relatively poor irrespective of the annealing temperature as compared with Examples (A)–(D). In addition, even when the phosphate aqueous solution having a large thermal expansion is blended as in the case of the sample (G), it was confirmed that it is difficult to secure the adhesion, when the concentration of the phosphate is too small. As a result that the present inventors had made experiments on the influence of varying the concentration of phosphate upon the adhesion with the base steel sheet, it was confirmed that the effect of enlarging the heat expansion coefficient of the insulating film layer disappears at a concentration of less than 25%, while when the concentration exceeds 60%, it is over the limit of the solubility of the phosphate and it is impossible that the phosphate is stably present as an aqueous solution, so that the concentration should be limited to a range of 25–60%.

In order to form the insulating film layer having a large thermal expansion coefficient, it is necessary to selectively use such kinds of the phosphates as to have a large heat expansion coefficient as the phosphate in the coating solution. That is, the phosphates of Na, K, Ca, Sr, Ba, Fe, Cd and Zn have relatively large thermal expansion coefficients, while those of Al and Mg have low thermal expansion coefficients. Therefore, it was confirmed that according to the second object of the invention, the coating solution should be prepared by using one or more phosphates containing Na, K, Ca, Sr, Ba, Fe, Cd and Zn with the large thermal expansion coefficients.

However, as a matter of course, the phosphates of Al and Mg may be used together with the phosphate having the relatively large heat expansion coefficient even at a high temperature annealing so long as the resulting insulating film layer has a satisfactory heat expansion coefficient.

Next, it is preferable that the base steel sheet used in the invention is a steel sheet containing 1.0–8.0% by weight of Si. In order to form the forsterite film on the surface of the steel sheet, decarburization and primary recrystallization annealing of a cold rolled steel sheet of 0.1–1.0 mm in thickness containing 1.0–8.0% of Si are performed at 600°–900° C. in wet hydrogen atmosphere to form a subscale mainly consisting of $SiO_2$ on the surface thereof, and the annealing separator mainly consisting of MgO is applied thereon, and annealing is carried out to form a thin forsterite ($2MgO.SiO_2$) base film on the steel sheet. If the Si content in the steel sheet is less than 1.0%, the adhesion is not only lowered, but also the production amount of the subscales containing $SiO_2$ is smaller, so that no appropriate forsterite film is formed. To the contrary, if the content of $SiO_2$ exceeds 8.0%, the adhesion becomes poor and the production amount of the subscale becomes too much, so that no excellent forsterite film is formed. The base steel sheet is not necessarily limited to the silicon steel sheet so long as the condition that it contains 1.0–8.0% is met, and stainless steel or other kinds of steel are usable.

According to the above-mentioned method, the more superior print circuit board excellent in the mechanical and thermal performances and smoothness can be manufactured even in the annealing at a high temperature at 900°–1,050° C. over a lower temperature range of 300°–900° C.

Embodiments according to the second object of the invention will be explained with reference to the following Examples, which are given merely in illustration of the invention and should never be interpreted to limit the scope thereof.

EXAMPLE 4

After a cold rolled silicon steel sheet containing 2.9% of Si was annealed at 800° C. in a wet hydrogen for 3 minutes, a slurry-like annealing separator containing 97% of MgO and 3% of $TiO_2$ was applied to the surface of the steel sheet at rate of 15 g/m² and annealing was performed at 1,100° C. in nitrogen gas for 3 hours to form a forsterite film layer. A coating solution containing strontium phosphate and colloidal silica at such a ratio that 25% strontium phosphate aqueous solution and 30% colloidal silica aqueous dispersion were mixed at 80 ml and 95 ml respectively was applied to the forsterite film layer thus formed to form an insulating film layer, upon which a conductive pattern was bonded, followed by annealing at 1,000° C. to obtain a print circuit board.

The print circuit board thus obtained had extremely excellent adhesion of the minimum diameter 15 mm at which no peeling occurred when it was bent at 180°, and was excellent in thermal resistance and the mechanical strength as well as the surface smoothness.

EXAMPLE 5

After a cold rolled silicon steel sheet containing 2.8% of Si was annealed at 800° C. in wet hydrogen for 3 minutes, a slurry-like annealing separator containing 95% of MgO and 5% of $TiO_2$ was applied to the surface of the steel sheet at a rate of 13 g/m$^2$, and annealing was performed at 1,100° C. in nitrogen gas for 3 hours. Then, a coating solution containing calcium phosphate, zinc phosphate and colloidal silica at such a rate that 25% calcium phosphate aqueous solution, 45% zinc phosphate aqueous solution and 20% colloidal silica aqueous dispersion were mixed at a ratio of 50 ml, 30 ml and 70 ml respectively was applied to the forsterite film to form an insulating film layer. Thereafter, a conductive pattern was bonded to the insulating film layer, and annealing was carried out at 950° C. to obtain a print circuit board.

The print circuit board thus obtained exhibited very excellent adhesion of the minimum diameter 10 mm in the bending test and was excellent in the thermal and mechanical characteristics and the surface smoothness with a beautiful gloss.

EXAMPLE 6

After a cold rolled silicon steel sheet containing 3.0% of Si was annealed at 800° C. in wet hydrogen for 3 minutes, a slurry-like annealing separator containing 95% of MgO and 5% of $TiO_2$ was applied to the surface of the steel sheet at a rate of 15 g/m$^2$, and annealing was carried out at 1,100° C. in nitrogen gas for 3 hours to form a forsterite film.

A coating solution consisting of potassium phosphate, barium phosphate, and colloidal silica at such a ratio that 55% potassium phosphate aqueous solution, 25% barium phosphate aqueous solution and 20% colloidal silica aqueous dispersion were mixed at 10 ml, 30 ml and 80 ml respectively was applied to the forsterite film to form an insulating film layer. Then, a conductive pattern was bonded to the insulating film layer, and annealing was carried out at 1,050° C. to obtain a print circuit board.

The adhesion of the print circuit board thus obtained exhibited excellent adhesion with the minimum diameter 20 mm in the bending test, and it was excellent in the thermal resistance and the mechanical strength as well as the surface quality.

EXAMPLE 7

After a cold rolled silicon steel sheet containing 2.9% of Si was annealed at 800° C. in wet hydrogen for 3 minutes, a slurry-like annealing separator containing 97% of MgO, 2% of $TiO_2$ and 1% of MnO was applied to the surface of the steel sheet at a rate of 14 g/m$^2$, and annealing was carried out at 1,100° C. in nitrogen gas for 3 hours to form a forsterite film layer. Then, a coating solution consisting of zinc phosphate, sodium phosphate and colloidal silica at such a ratio that 55% zinc phosphate aqueous solution, 50% sodium phosphate aqueous solution and 20% colloidal silica aqueous dispersion were mixed at 40 ml, 10 ml and 80 ml respectively was applied to the forsterite film layer to form an insulating film layer. Then, a conductive pattern is bonded to the insulating film layer, and annealing was carried out at 1,000° C. to obtain a print circuit board.

The print circuit board thus obtained exhibited extremely excellent adhesion with the minimum diameter of 10 mm in the bending test, and was excellent in the thermal resistance and the mechanical strength as well as the surface smoothness.

EXAMPLE 8

After a cold rolled silicon steel sheet containing 3.1% of Si was annealed at 800° C. in wet hydrogen for 3 minutes, an annealing separator mainly consisting of MgO was applied to the surface of the steel sheet at a rate of 13 g/m$^2$, and annealing was performed at 1,150° C. in nitrogen gas for 3 hours to form a forsterite film layer. A coating solution consisting of calcium phosphate and colloidal silica at such a ratio that 25% calcium phosphate aqueous solution and 20% colloidal silica aqueous dispersion were mixed at 80 ml and 70 ml respectively was applied to the forsterite film layer to form an insulating film thereon. Then, a conductive pattern was bonded to the insulating film layer, and annealing was carried out at 950° C. to obtain a print circuit board.

The print circuit board thus obtained exhibited extremely excellent adhesion with the minimum diameter of 10 mm in the bending test, and was excellent in the thermal resistance and the mechanical characteristics as well as the surface smoothness.

As obvious from the above Examples, according to the methods of manufacturing the substrate for print circuit board and the print circuit board of the second object of the invention, the concentration of the phosphate in the phosphate aqueous solution is limited to 25-60%, and the annealing temperature after the conductive pattern is bonded is more than 900° C. and less than 1,050° C., whereby the adhesion between the coated film layers and the base steel sheet is made extremely excellent, so that the substrate for the print circuit board and the print circuit board which are excellent in the mechanical strength and the thermal resistance as well as the surface quality can be stably produced. Thus, the invention is to provide the substrate for print circuit board and the print circuit board which are satisfactorily applicable to the severe used conditions for the future print circuit board.

Next, the method of manufacturing the substrate for print circuit board and the print circuit board according to the third object of the invention will be explained more in detail below.

Ordinarily, the forsterite film formed on the steel sheet is formed by reacting subscales consisting mainly of $SiO_2$ near the surface of the grain oriented silicon steel sheet with an annealing separator mainly consisting of MgO used for preventing seizing steel sheets at the final finish annealing.

Since this forsterite film has large influence upon the magnetic performance, a step of forming a thin film of an excellent uniformity is adopted for the film of the high grade grain oriented silicon steel sheet. However, in order to enhance the adhesion of the steel sheet, which is the third object of the invention, a method quite different from that conventionally used for manufacturing the grain oriented silicon steel sheet is necessary. The present inventors have made numerous experiments, and have found that to the annealing separator mainly consisting of MgO is added a restricted amount of serpentine, and optionally further a restricted amount of an oxide of Mn and an oxide of Ti to render the adhesion of the forsterite film formed on the surface of the steel sheet during annealing (at 950°-1,100° C.) extremely excellent. The adhesion to the steel sheet is excellent even after annealing is done for the insulating film layer which covers the forsterite film and is formed by baking the coating solution mainly consisting of phosphate and colloidal silica. The conductive pattern formed on the insulating film layer through bonding, and particularly, the substrate for print circuit board and the print circuit board are excellent in the thermal and mechanical characteristics produced.

The inventors have also found that the print circuit board according to the invention in which the insulating film (mainly consisting of the phosphate and the colloidal silica) is formed on the forsterite film layer formed on the steel sheet, and the enamel layer is formed thereon, and further the conductive pattern is formed thereon is excellent in the thermal and mechanical characteristics.

Next, embodiments according to the third object of the invention will be explained more in detail by referring to specific Examples, which are merely illustrative of the invention and should never be interpreted to limit the scope thereof.

After subscales mainly consisting of $SiO_2$ were formed on the surface of the silicon steel sheet of 0.35 mm in thickness containing 3.0% of Si (by subjecting the silicon steel sheet to the primary recrystallization annealing including decarburization), a slurry-like annealing separator with one of seven kinds of the compositions shown in Table 3 was applied to the surface of the steel sheet at an application rate of 12 g/m². Then, the steel sheet thus treated was annealed at 1,100° C. in nitrogen gas for 3 hours to form a forsterite film layer on the surface of the steel sheet. After an insulating film layer is formed by baking a coating solution mainly consisting of phosphate and colloidal silica onto the forsterite film layer. Then, a conductive pattern was formed on the insulating film layer to obtain a print circuit board. As to the adhesion between the steel sheet thus obtained and the forsterite film layer of the print circuit board, the minimum diameter (mm) at which no peeling occurred in the bending test at 180° was measured, and results thereof were also shown in Table 3.

TABLE 3

| Sample | Symbol | Compounding ratio of annealing separator | Print circuit board having conductive pattern on insulating film layer mainly made from phosphate and colloidal silica which is formed on forsterite film layer |
|---|---|---|---|
| Present invention | (A) | Serpentine:25% MgO:70% MnO:5% | 15 |
|  | (B) | Serpentine:25% MgO:70% TiO$_2$:5% | 15 |
|  | (C) | Serpentine:25% MgO:70% Mn$_3$O$_4$:3% TiO$_2$:2% | 20 |
|  | (D) | Serpentine:30% MgO:70% | 25 |
| Reference Example | (E) | MgO:95% TiO$_2$:5% | 40 |
|  | (F) | MgO:96% TiO$_2$:2% SrSO$_4$:2% | 45 |
|  | (G) | MgO:100% | 50 |

It is seen from Table 3 that the adhesion to the steel sheet in the print circuit board using the annealing separator in Examples (A)-(D) of the invention are far more excellent as compared with Reference Examples (E)-(G). The method of using the annealing separator in Reference Examples (F) and (G), inter alia (G) is a film-forming method of increasing the magnetic performances by the thin and uniform film, which is used in the production of the recent grain oriented silicon steel sheet. Further, the annealing separator of Reference Example (E) is characterized in that Ti compound is added to the annealing separator to ensure the adhesion to the steel sheet. However, in the print circuit board in which the thicker insulating film layer is formed on the forsterite film layer, it is clear from Table 3 that even if the Ti compound is added into the annealing separator, the adhesion to the steel sheet are not enhanced unlike in the case of Examples (A)-(D).

As mentioned above, it is clear from the comparing description between the present invention and Reference Examples that the manufacturing methods of the substrate for print circuit board and the print circuit board according to the invention have a fundamentally different idea in that the forsterite film layer and the insulating film layer are used in the substrate for the print circuit board, so that the effects exhibited thereby naturally differ.

Next, the reasons why the manufacturing conditions according to the third object of the invention are restricted as mentioned below.

First, it is preferable that the base steel sheet contains 1.0-8.0% of Si. This is because the subscales mainly consisting of $SiO_2$ are required to be formed on the surface of the steel sheet before final annealing to form the forsterite film on the surface of the steel sheet. Such a cold rolled silicon steel sheet of 0.1-1.0 mm in thickness containing 1.0-8.0% of Si is subjected to the decarburization and primary recrystallization annealing at 600°-1,050° C. in wet hydrogen atmosphere to form the subscales mainly consisting of $SiO_2$ on the surface thereof. The annealing separator mainly consisting of MgO which is then applied to the surface of the steel sheet is restricted as follows:

That is, the annealing separator used in the invention mainly consists of MgO, and contains powder of serpentine. The serpentine is a rock metamorphosed from the olivine upon receipt of the metamorphosing action, and contains as main components, antigorite or cryntile, talc, magnesite ($MgCO_3$), dolomite ($CaCO_3.MgCO_3$), beryl and so on. Antigorite and cryntile are both a flaky hydrous magnesium silicate represented by a chemical formula $3MgO.2SiO_2.2H_2O$, and they are generally called serpentine.

In order to form the excellent forsterite film, it is necessary to add 1-40% by weight of the serpentine to the annealing separator and apply it at a rate of 0.1-10 g/m². If the addition amount of serpentine is less than 1%, the effect of increasing the adhesion is not obtained, whereas if it exceeds 40%, it is impossible to stably form the forsterite film. For these reasons, the addition amount of serpentine is limited to a range of 1-40%.

As mentioned above, the substrate for print circuit board and the print circuit board which have the excellent adhesion to the steel sheet can be manufactured by adding a restricted amount of serpentine to the annealing separator. Further, when a restricted amount of one or more kinds of an oxide of Mn and an oxide of Ti are added to the annealing separator, the third object of the invention can be more effectively attained. Explanation will be made below on fundamental experiments thereof.

That is, after a silicon steel sheet of 0.35 mm in thickness containing 3.00% of Si was subjected to the primary recrystallization annealing including decarburization to form subscales mainly consisting of $SiO_2$ on the surface thereof, the slurry-like annealing separator containing serpentine, an oxide of Mn, and an oxide of Ti at the different compounding ratios was applied to the steel sheet at a rate of 12 g/m². Then, the steel sheet thus treated was annealed at 1,100° C. in $N_2$ gas for 3 hours to form a forsterite film on the surface of the steel sheet. A coating solution mainly consisting of a phosphate and a colloidal silica was applied and baked upon the forsterite film to form an insulating film layer, and conductive pattern was formed on the insulating layer to produce a print circuit board. In order to examine the adhesion between the steel sheet and the insulating film layer of the print circuit board, the minimum diameter (mm) at which no peeling occurred at the 180° bending test was determined, and results thereof are shown in FIG. 3 in relation to the compounding rate of the annealing separator. Indicating symbols in FIG. 3 show the following minimum diameters (mm) at which no peeling occurred in the adhesion tests.

○ : 15–20 mm
△ : 21–25 mm
x: more than 25 mm

Based on the compounding range which gives especially excellent adhesion in FIG. 3, the compounding rate of the annealing separator in the invention was so restricted that one or two kinds of the oxide of Mn and the oxide of Ti are contained in an amount of 1–30% respectively in addition to 1–40% serpentine. The application amount of the annealing separator according to the invention as compounded above in the restricted amounts is preferably in a range of 0.15–20 g/m².

According to the invention, a small amount of the conventionally known additive such as oxide of V, Cr, Fe, Nb, Mo, Zr, Ni, Al, B or the like or a small amount of compounds containing these elements may be added to the annealing separator.

According to the present invention, the annealing separator as compounded above in the restricted amounts is applied and annealing is carried out to form the forsterite film layer on the steel sheet, the insulating film layer is formed on the forsterite film layer by baking the coating solution mainly consisting of the phosphate and colloidal silica, and the conductive pattern is formed on the insulating film layer, whereby the substrate for print circuit board and the print circuit board which have excellent adhesion can be obtained. Further, in order to obtain the substrate for print circuit board and the print circuit board which are specially excellent in insulating property, an enamel layer is formed on the insulating film layer which is formed on the forsterite film layer by baking the coating solution mainly consisting of the phosphate and the colloidal silica and then the insulating layer is formed thereon so that the insulating film layer may be made thicker.

Embodiments according to the third object of the invention will be explained in the following, but they are merely illustrative of the invention and should never be interpreted to limit the scope thereof.

EXAMPLE 9

After a cold rolled silicon steel sheet containing 3.1% of Si was annealed at 800° C. in wet hydrogen for 3 minutes, an annealing separator containing 30% of serpentine, 50% of MgO, and 20% of MnO was applied onto the surface of the steel sheet at a rate of 15 g/m², and annealing was carried out at 1,100° C. in $N_2$ gas for 3 hours to form a forsterite film layer. A coating solution containing 15% of calcium phosphate and 40% of colloidal silica was applied to the forsterite film, and baked to form an insulating film layer. Then, a conductive pattern was bonded to the insulating film layer to obtain a print circuit board. The adhesion of the print circuit board thus obtained which was represented by the minimum diameter at which no peeling occurs at the 180° bending test was as extremely excellent as 10 mm, and the print circuit board was excellent in the heat resistance and the mechanical strength as well as the surface smoothness with the beautiful gloss.

EXAMPLE 10

After a cold rolled silicon steel sheet containing 2.9% of Si was annealed at 800° C. in wet hydrogen for 3 minutes, a slurry-like annealing separator containing 35% of serpentine, 55% of MgO, 5% of MnO, and 5% of $TiO_2$ was applied to the surface of the steel sheet at a rate of 13 g/m², and annealing was carried out at 1,150° C. in $N_2$ gas for 3 hours to obtain a forsterite film.

A coating solution containing magnesium phosphate and colloidal silica at a rate of 35% and 30% respectively was applied and baked onto the forsterite film to obtain an insulating film layer, and a conductive pattern was bonded to the insulating film layer to obtain a print circuit board. This print circuit board was extremely excellent in the adhesion with the minimum diameter of 10 mm as well as the heat resistance and the mechanical strength with the good surface quality.

EXAMPLE 11

After a cold rolled silicon steel sheet containing 2.9% of Si was annealed at 800° C. in wet hydrogen for 3 minutes, an annealing separator containing 25% of serpentine, 70% of MgO, and 5% of $TiO_2$ was applied on the surface of the steel sheet at a rate of 14 g/m², and annealing was carried out at 1,100° C. in $N_2$ gas for 3 hours to obtain a forsterite film layer.

A coating solution containing aluminum phosphate, iron phosphate and colloidal silica at such a ratio that 30% aluminum phosphate aqueous solution, 19% iron phosphate aqueous solution and 20% colloidal silica aqueous dispersion were mixed at 10 cc, 70 cc and 90 cc respectively was applied and baked onto the forsterite film to form an insulating film layer. Then, an enamel layer was formed on the insulating film layer, and a conductive pattern was bonded to the enamel layer to obtain a print circuit board. The print circuit board thus obtained was excellent in the heat resistance and mechanical strength with the beautiful surface and an excellent adhesive with 15 mm in the minimum diameter at the bending test.

EXAMPLE 12

After a cold rolled silicon steel sheet containing 2.8% of Si was annealed at 800° C. in wet hydrogen for 3 minutes, a slurry-like annealing separator containing 30% of serpentine, 60% of MgO, 5% and $Mn_2O_3$ and 5% of $TiO_2$ was applied to the surface of the steel sheet at a rate of 14 g/m², and annealing was carried out at 1,100° C. in $N_2$ gas for 3 hours to obtain a forsterite film.

A coating solution containing 40% of calcium phosphate and 20% of colloidal silica was applied and baked on to the forsterite film to form an insulating film layer. Then, a conductive pattern was bonded to the insulating film layer to obtain print circuit board. The print circuit board thus obtained had an extremely excellent adhesion with 10 mm in the minimum diameter, and was excellent in the heat resistance.

As obvious from the foregoing Examples, according to the present invention, 1–40% of serpentine is added to the annealing separator mainly consisting of MgO, and further 1–30% of an oxide of Mn, and 1–30% of an oxide of Ti are contained therein. This annealing separator is applied to the surface of the steel sheet and annealed is carried out to form the forsterite film layer, and then the forsterite film layer is subjected to any one of the following treatments:

(A) The insulating film layer mainly consisting of phosphate and colloidal silica is formed.
(B) The insulating film layer mainly consisting of phosphate and colloidal silica is formed, and then the enamel layer is further formed thereon.

The print circuit board which is obtained by forming the conductive pattern on the steel sheet thus treated has the following excellent effects:

(a) Since the print circuit board is extremely excellent in the mechanical and thermal characteristics, it can fully meet the increase in the integrality and the increasing capacity.
(b) The insulating property is enlarged by the combination of the insulating film layer mainly consisting of phosphate and colloidal silica and the enamel layer.
(c) Particularly, the adhesion between the base steel sheet and the insulating film layer, between the insulating film layer and the conductive pattern, between the enamel layer and the conductive pattern, and between the insulating film layer and the enamel layer are all extremely excellent.
(d) The surface smoothness is excellent and no swelling is seen at the edge portion and in the vicinity of the through holes of the substrate for print circuit board and the print circuit board.

Next, the substrate for print circuit board and the print circuit board according to the fourth object of the present invention will be explained as follows:

The present inventors have made various studies and trial experiments, and have found that more excellent effects can be obtained in the case when plural coated layers are used instead of the case when a single layer of the insulating film layer of the coating solution (mainly consisting of the phosphate and the colloidal silica) or the enamel layer is applied as an insulating layer. The present invention has been accomplished based on this acknowledgement.

Examples of the invention will be explained in comparison with the conventional print circuit board made from the enamel substrate.

Figure 4:
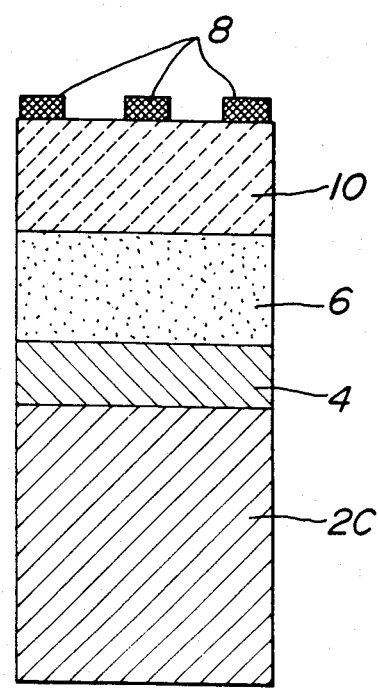
FIG. 4 is an enlarged section view of the construction of the print circuit board according to another embodiment of the invention.

According to the print circuit board of the invention shown in FIG. 4, the annealing separator mainly consisting of MgO is applied to the steel sheet 2C containing 0.1–8.0% of Si, annealing is carried out at 1,100° C. in $N_2$ gas for 30 minutes to form a forsterite film layer 4 on the surface of the steel sheet 2C, and the coating solution mainly consisting of the phosphate and colloidal silica is applied and baked to the forsterite layer to form an insulating film layer 6. Then, an enamel layer 10 is formed on the insulating film layer 6, and the conductive pattern 8 is formed on the enamel layer.

The conventional enamel print circuit board shown in FIG. 2 has the drawbacks that the bubbles 14 are formed in the enamel layer 10 to lower the voltage tolerance, and that in order to avoid the reduction in the adhesion to the ink for printing the conductive pattern 8 and the insulating resistance due to the ion migration as well as change in quality of the conductive ink in forming the enamel layer 10, since alkali metal oxide is decreased at minimum, the wetting property to the steel sheet 2C is poor whereby excellent adhesion cannot be obtained.

In Table 4 are shown the insulating resistance of the print circuit boards and the adhesion to the base steel of the DIN 51156 as shown in FIGS. 2 and 4. It is understood from Table 4 that the insulating resistance and the adhesion of the print circuit board according to the example of the invention are far more excellent than the conventional examples.

The print circuit board shown as Reference Example in Table 4 in which the enamel film layer is interposed between the forsterite film layer and the coating film layer is inferior to that of the invention in terms of the insulating property. This is considered to be because Na, K, etc. contained in the enamel layer breaks the forsterite film layer during the succeeding annealing procedure.

TABLE 4

| FIG. No. | Production of print circuit board | Insulating property ($\Omega$ cm) | Adhesion (kg) | Sample |
|---|---|---|---|---|
| FIG. 4 | forsterite film layer → coating film layer → enamel layer → conductive pattern | $5 \times 10^{18}$ | 5.5 | Invention example |
| Reference | forsterite film layer → enamel film layer → coating film layer → conductive pattern | $3 \times 0^{18}$ | 5.0 | Reference example |
| FIG. 2 | nickel-flashing layer → enamel film layer → conductive pattern | $4 \times 10^{10}$ | 3.0 | Conventional example |

It is possible to multiply laminate the combination of the insulating layer made from the coating solution and the enamel film layer upon necessity.

The enamel layer ordinarily has the thickness of 100–200 μm, and the hollow holes are contained therein. To the contrary, the thickness of the enamel layer formed on the phosphate film layer according to the present invention is 50 μm at the most, and preferably 20–30 μm. When the thickness of the enamel layer is thinner like this, no hollow holes are formed in the enamel layer, so that the surface smoothness is not lost.

Embodiments according to the fourth object of the invention will be explained below. They are merely illustrative of the invention and should never be interpreted to limit the scope thereof.

EXAMPLE 13

An annealing separator mainly consisting of MgO was applied to a steel sheet containing 2.8% of Si, and annealing was carried out at 1,100° C. in $N_2$ gas for 30 minutes to form a forsterite layer on the surface of the steel sheet. Then, a coating solution containing magnesium phosphate, barium phosphate and colloidal silica at such a ratio that 25% of the magnesium phosphate aqueous solution, 25% of barium phosphate aqueous solution and 30% colloidal silica aqueous dispersion were mixed at 80 cc, 15 cc and 100 cc respectively were applied and baked onto the forsterite film layer to form an insulating layer. Thereafter, an enamel layer was formed on the insulating layer, and a conductive pattern was bonded to the enamel film layer, and annealing was performed at 750° C. for ten minutes. The print circuit board thus obtained was excellent in the insulating property and adhesion of the conductive pattern as well as the heat resistance and the mechanical strength with the surface smoothness, a beautiful gloss, and an excellent quality.

EXAMPLE 14

An annealing separator mainly consisting of MgO was applied to a steel sheet containing 3.1% of Si, and annealing was carried out at 1,100° C. in $N_2$ gas for 30 minutes to form a forsterite film layer. Then, a coating solution containing calcium phosphate and colloidal silica at such rate that 13% calcium phosphate aqueous solution and 40% colloidal silica aqueous dispersion were mixed at 60 cc and 100 cc respectively was applied and baked onto the forsterite film layer to form an insulating film layer. Thereafter, an enamel layer was applied on the insulating film layer, and a conductive pattern was bonded to the enamel layer and annealing was carried out at 850° C. for one minute. The print circuit board thus obtained was excellent in quality as in the case of Example 13.

EXAMPLE 15

An annealing separator mainly consisting of MgO was applied to a steel sheet containing 3.0% of Si, and annealing was carried out at 1,100° C. in $N_2$ gas for 30 minutes to form a forsterite film layer on the surface of the steel sheet. Then, a coating solution containing aluminum phosphate, strontium phosphate and colloidal silica at such a ratio that 35% aluminum phosphate aqueous solution, 20% strontium phosphate aqueous solution and 30% colloidal silica aqueous dispersion were mixed at 20 cc, 70 cc and 100 cc respectively was applied and baked onto the forsterite layer to form an insulating film layer, and an enamel layer was formed on the insulating layer. Thereafter, a conductive pattern was bonded to the enamel layer, and annealing was carried out at 700° C. for 2 minutes. The print circuit board thus obtained was excellent in quality as in the case of Example 13.

EXAMPLE 16

A cold rolled silicon steel sheet containing 2.9% of Si was annealed at 800° C. in wet hydrogen for 3 minutes, and a slurry-like annealing separator containing 30% of serpentine, 60% of MgO, 5% of $Mn_2O_3$ and 5% of $TiO_2$ was applied to the surface of the steel sheet at an application amount of 15 g/m², and annealing was carried out at 1,150° C. in $N_2$ gas for 3 hours to form a forsterite film layer. To this forsterite film layer was applied a coating solution containing calcium phosphate and colloidal silica at such a rate that 40% calcium phosphate aqueous solution and 20% colloidal silica aqueous dispersion were mixed at 65 cc and 70 cc respectively, thereby forming an insulating film layer. Thereafter, a conductive pattern was bonded to this insulating film layer, and firing was carried out at 1,050° C. to form a print circuit board. The print circuit board thus obtained had an excellent adhesion of 15 mm (the minimum diameter at which no peeling occurred at 180° bending test). The other qualities thereof were excellent as in the case of Example 13.

As obvious from the foregoing Examples, according to the substrate for print circuit board and the print circuit board of the invention, the forsterite base film layer is formed on the steel sheet preferably containing 1.0-8.05 of Si, the insulating film layer mainly consisting of the phosphate and colloidal silica is formed thereon, and the enamel layer is formed on the insulating film layer, and further the conductive pattern is formed on the laminated film layer, and the substrate for print circuit board and the print circuit board of the invention have the following excellent effects:

(1) Since they are conspicuously excellent in the mechanical and thermal characteristics, they fully comply with the increase in the integrality and the capacity-increasing tendency.

(2) The insulating property is made large by the combination of the film layer mainly consisting of the phosphate and colloidal silica and the enamel layer.

(3) The adhesion between the base steel sheet and the insulating film layer and between the insulating film layer and the conductive pattern are both extremely excellent.

(4) The surface smoothness is excellent, and no swelling is observed at the edge portion of the print circuit board and around through holes.

The base steel sheet used in connection with the fourth object of the invention is not restricted to silicon steel sheet, and other kinds of steel including stainless steel may widely be used so long as they contain 1.0-8.0% of Si.

What is claimed is:

1. A substrate for print circuit board comprising a steel sheet which contains 1.0-8.0% of Si, and a forsterite film layer on at least one surface of the steel sheet, and an insulating film layer disposed on the forsterite film layer, said insulating film layer being in the form of a baked solution of a phosphate and colloidal silica, the forsterite film layer being in the form of the reaction product of MgO in an annealing separator applied onto the steel sheet and $SiO_2$ in the silicon steel sheet.

2. A substrate for print circuit board according to claim 1, wherein the phosphate comprises at least one phosphate selected from phosphates of Mg, Al, Na, K, Ca, Sr, BA, Fe, Cd and Zn.

3. A substrate for print circuit board according to claim 1, wherein the phosphate contains at least one phosphate selected from phosphates of Na, K, Ca, Sr, Ba, Fe, Cd and Zn.

4. A substrate for print circuit board according to claim 1, wherein the thickness of the forsterite film layer is 1-4 μm.

5. A substrate for print circuit board according to claim 1, wherein the thickness of the insulating film layer is 3-50 μm.

6. A substrate for print circuit board according to claim 1, wherein the forsterite film layer is formed on at least one surface of the steel sheet and said insulating film layer being formed by baking a coating solution consisting of a phosphate and colloidal silica.

7. A print circuit board comprising a steel sheet which contains 1.0-8.0% of Si, and a forsterite film layer formed on at least one surface of the steel sheet, and an insulating film layer disposed on the forsterite film layer, said insulating film layer being in the form of a baked solution of a phosphate and a colloidal silica, and a conductive pattern bonded on the surface of said insulating film layer, the forsterite film layer being in the form of the reaction product of MgO in an annealing separator applied onto the steel sheet, and $SiO_2$ in the silicon steel sheet.

8. A print circuit board according to claim 7, wherein on the conductive pattern is further formed another insulating film layer for the protection of the conductive pattern by baking a coating solution mainly consisting of a phosphate and colloidal silica.

9. A print circuit board according to claim 8, wherein one or more of combinations each consisting of a conductive pattern and an insulating film layer for the protection of the conductive pattern are formed on said another insulating film layer.

10. A print circuit board according to claim 7, wherein an enamel layer is interposed between the insulating film layer and the conductive pattern.

11. A print circuit board according to claim 10, wherein the thickness of the enamel layer is not more than 50 $\mu$m.

12. A print circuit board according to claim 7, wherein the phosphate comprises at least one phosphate selected from phosphates of Mg, Al, Na, K, Ca, Sr, Ba, Fe, Cd and Zn.

13. A print circuit board according to claim 7, wherein the phosphate contains at least one phosphate selected from phosphates of Na, K, Ca, Sr, Ba, Fe, Cd and Zn.

14. A print circuit board according to claim 7, wherein the thickness of the forsterite film layer is 1-4 $\mu$m.

15. A print circuit board according to claim 7, wherein the thickness of the insulating film layer is 3-50 $\mu$m.

16. A print circuit board according to claim 7, wherein said insulating film layer is formed on the forsterite film layer, said insulating film layer being formed by baking a coating solution consisting of a phosphate and colloidal silica, and a conductive pattern is formed on said insulating film layer.

* * * * *